United States Patent [19]

Colineau et al.

[11] 4,425,533
[45] Jan. 10, 1984

[54] GENERATOR FOR PRODUCING A D.C. SUPPLY VOLTAGE IN A TELEVISION RECEIVER COMPRISING A VERTICAL SCANNING CIRCUIT

[75] Inventors: Joseph Colineau; Gerard Rilly, both of Paris, France

[73] Assignee: Thomson-Brandt, Paris, France

[21] Appl. No.: 211,206

[22] Filed: Nov. 28, 1980

[30] Foreign Application Priority Data

Dec. 4, 1979 [FR] France ............... 79 29765

[51] Int. Cl.³ .................... H01J 29/70; H01J 29/76
[52] U.S. Cl. ..................... 315/408; 315/393; 315/411
[58] Field of Search ................ 315/408, 411, 393

[56] References Cited

U.S. PATENT DOCUMENTS 3,868,538  2/1975  Blanchard ............... 315/411
4,034,262  7/1977  Dietz ....................... 315/408
4,322,663  3/1982  Rilly ....................... 315/408

FOREIGN PATENT DOCUMENTS 2318545  2/1977  France .

Primary Examiner—Theodore M. Blum
Attorney, Agent, or Firm—Roland Plottel

[57] ABSTRACT

The current which passes through the vertical deflector of a transistorized color television receiver is produced by a circuit comprising an active switch controlled and modulated at the line frequency and supplied by line retrace pulses delivered by the secondary winding of a line transformer. The voltage at the terminals of an assembly comprising a capacitor in series with the vertical deflector has a constant sign which is independent of the current passing through the deflector. The same secondary winding of the line transformer supplies both the vertical scanning circuit and a rectifier circuit for producing a d.c. voltage, in particular for the supply of video amplifiers.

5 Claims, 8 Drawing Figures

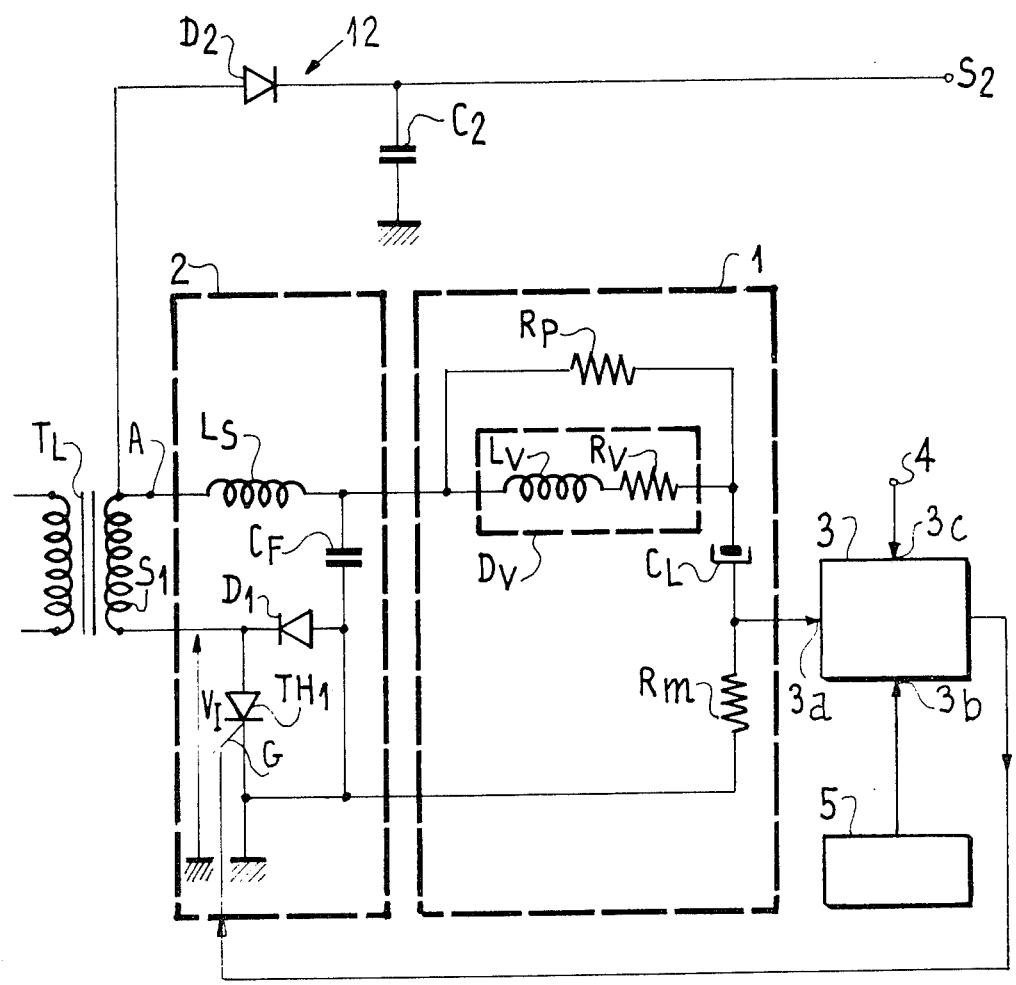
FIG_1

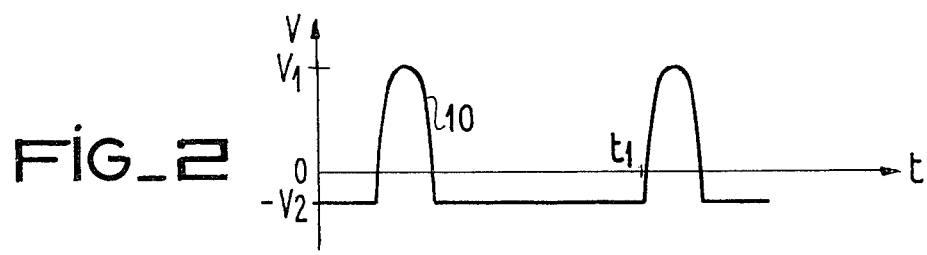
FIG_2
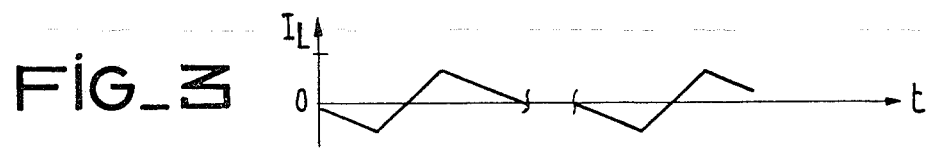
FIG_3
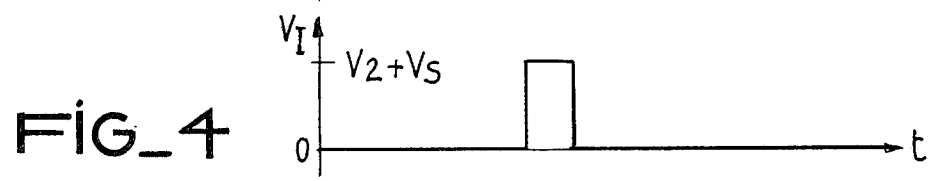
FIG_4
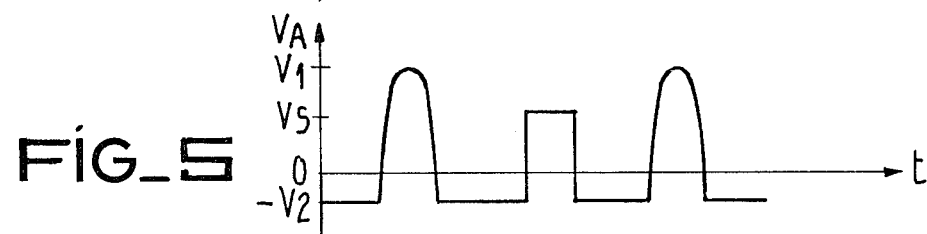
FIG_5
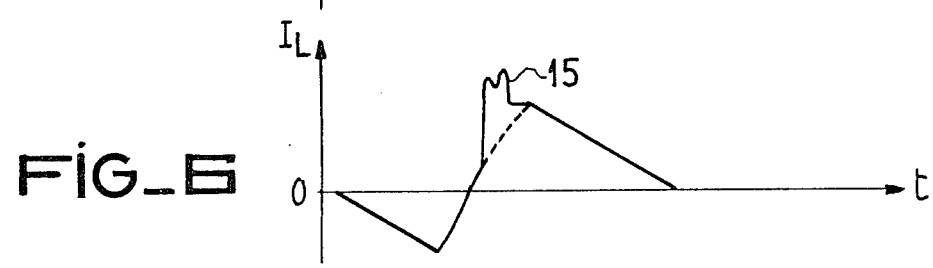
FIG_6
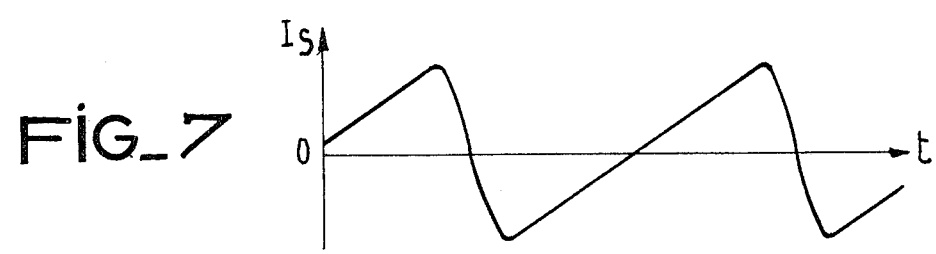
FIG_7
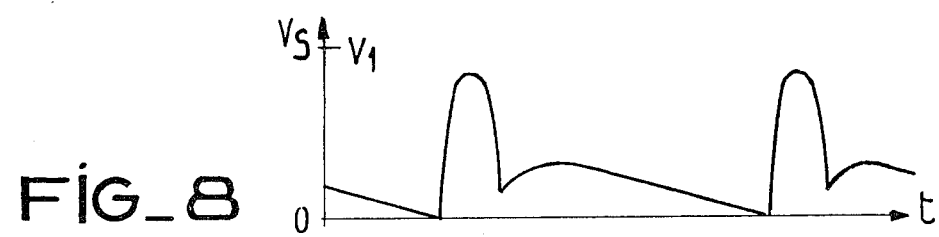
FIG_8

GENERATOR FOR PRODUCING A D.C. SUPPLY VOLTAGE IN A TELEVISION RECEIVER COMPRISING A VERTICAL SCANNING CIRCUIT

This invention relates to a generator for producing a d.c. supply voltage in a television receiver of the switched-mode field-scanning circuit type described in U.S. patent application No. 58,982 of July 20, 1979 U.S. Pat. No. 4,322,663, assigned to the same assigneee as the present application.

The vertical scanning circuit described in said patent Application comprises a coil for vertical deflection of the electron beam of the cathode-ray tube of the television receiver, the coil being supplied with electric current by a generator which draws power solely from the line retrace pulses or in other words from the overvoltage obtained at the terminals of the horizontal deflector when the current falls to zero within this latter. These line retrace pulses are recovered at the terminals of the secondary winding of a so-called line transformer having the function of supplying a rectifier circuit in series with an active switch which conducts current in both directions and is controlled so as to ensure that the current delivered to the vertical deflector in series with a high-capacitance capacitor varies in the desired manner, that is, substantially in a sawtooth waveform. At each line, said switch is accordingly conductive during a period of time which is a function of the number of said line.

Moreover, the video amplifiers which drive the three electron guns of the cathode-ray tube of a color television receiver have been supplied up to the present time with a d.c. voltage of the order of 200 volts, also by rectification of line retrace pulses delivered by a second secondary winding of the very-high-voltage transformer or line transformer.

Said line transformer therefore has at least two secondary windings, namely one winding for the vertical scanning circuit and the other for d.c. supply to the video amplifiers.

In accordance with the invention, the same secondary winding of the line transformer supplies both the vertical scanning circuit and a rectifier circuit, a d.c. voltage being obtained at the terminals of said rectifier circuit in particular for supplying current to the video amplifiers.

It has in fact been found that the d.c. voltage thus collected does not affect the current delivered to the vertical deflector which must vary in a well-determined manner in order to ensure that a non-deformed image is reproduced by the television receiver.

There is thus no need to provide a second secondary winding for the line transformer and a television receiver which is constructed without this winding is accordingly reduced in size as well as in cost. This advantage is appreciable in the case of mass-produced transistorized color receivers.

These and other features of the invention will be more apparent upon consideration of the following description and accompanying drawings, wherein:

FIG. 1 is a diagram of a circuit in accordance with the invention;

FIGS. 2 to 8 are diagrams showing the operation of the circuit of FIG. 1.

The scanning circuit shown in FIG. 1 comprises a vertical deflector $D_v$ which is equivalent to an inductance coil $L_v$ and a resistor $R_v$ in series, said resistor being in parallel with a resistor $R_p$ and in series with a coupling capacitor $C_L$ and a measuring resistor $R_m$.

The assembly formed by said deflector $D_v$, the capacitor $C_L$ and the resistor $R_m$ as well as the resistor $R_p$ forms the load impedance 1 of a generator 2.

The capacitor $C_L$ is of the polarizable electro-chemical type and is chosen so as to have a terminal voltage of sufficiently high mean positive value to ensure that a positive voltage is always obtained at the load terminals irrespective of the direction of flow of current through the deflector $D_v$.

The generator 2 must therefore be bidirectional in current but unidirectional in voltage.

Said generator 2 comprises a bidirectional-current, unidirectional-voltage active switch constituted in the example under consideration by a thyristor $TH_1$ and a diode $D_1$ which are mounted in opposite directions. Said switch is in series with the secondary winding $S_1$ of a line transformer $T_L$ and with an inductance coil $L_S$ which is not coupled to the transformer and a capacitor $C_F$.

The cathode of the thyristor $TH_1$ and the anode of the diode $D_1$ are connected to ground.

The capacitor $C_F$ is connected between ground and the opposite terminal of the inductance coil $L_S$ with respect to the terminal which is connected to the winding $S_1$.

The inductance $L_S$ and the capacitor $C_F$ have the design function of filtering the voltage delivered by the winding $S_1$ at a frequency of 16 kHz.

The capacitance of the capacitor $C_F$ is of sufficiently high value to ensure that a practically steady-state voltage appears across the capacitor terminals.

The trigger G of the thyristor $TH_1$ is connected to a control circuit 3 for delivering pulses such that, at each line, the thyristor is in the conducting state during a time interval which is a function of the line number.

By way of alternative, a transistor of the n-p-n or p-n-p type or a switch of any other type is employed instead of a thyristor.

During the field-scanning interval, the winding $S_1$ of the transformer $T_L$ delivers line retrace pulses 10 (as shown in FIG. 2) having peak values $V_1$ and $-V_2$.

The mean value of the current flowing through the deflector $D_v$ is practically equal to the mean value of the current flowing through the inductance coil $L_S$.

The variations in current intensity $I_L$ within the inductance coil $L_S$ as a function of the time t are shown in FIG. 3.

The diagram of FIG. 4 shows the variations in voltage $V_I$ as a function of the time t at the terminals of the active switch consisting of the thyristor $TH_1$ and the diode $D_1$. FIG. 5 shows the variations in potential at the junction point A between the winding $S_1$ and the inductance coil $L_S$.

As shown in FIG. 3, the current variation within the inductance coil $L_S$ depends on the instant of turn-on of the thyristor $TH_1$. Thus the mean intensity of the current within said inductance coil and therefore the intensity of the current within the vertical deflector $D_v$ is dependent on said instant of turn-on.

As the thyristor $TH_1$ is turned-on at an instant which is in advance or "leads" to a greater extent with respect to the instant $t_1$ of commencement of a line retrace interval, so the mean current within the inductance coil $L_S$ decreases to a greater extent with respect to its corresponding maximum value in the event that the thyristor $TH_1$ is still in the nonconducting state.

The control circuit 3 is of the negative feedback type and comprises an input $3_a$ to which the terminal voltage of the resistor $R_m$ is applied, and an input $3_b$ connected to the output of a generator 5 for delivering a sawtooth voltage after waveform corrections such as the correction at S which is the image of the current required for good vertical deflection. One input $3_c$ receives pulses at the line frequency for synchronization of the control circuit 3 at this frequency.

When the voltage at the terminals of the resistor $R_m$ increases, the instant of turn-on of the thyristor $TH_1$ is advanced in time, the current within the deflector decreases and, similarly, the voltage at the terminals of the measuring resistor $R_m$ decreases. This in fact results in the achievement of a regulation such that the current which flows through the vertical deflector $D_v$ is an image of the voltage delivered by the generator 5.

FIG. 5 shows that the voltage obtained between the point A and ground varies as the voltage delivered by the winding $S_1$ between the values $V_1$ and $-V_2$.

In accordance with the invention, the anode of a diode $D_2$ is connected at the point A whilst the cathode of said diode is connected to ground through a capacitor $C_2$.

The line retrace pulses are rectified by the circuit 12 consisting of a diode $D_2$ and a capacitor $C_2$; a d.c. voltage is provided at the terminals of said capacitor $C_2$ and available at the output $S_2$, especially for the supply of the video stage of the television receiver.

The operation of the vertical scanning circuit is not affected by the parallel connection of said rectifier circuit. In fact, the diode $D_2$ is clearly in the conducting state at the same time as the diode $D_1$ since it is connected in the same direction as this latter. In other words, the diode $D_2$ is in the conducting state when the active switch is closed or in other words when the winding $S_1$ delivers power. Thus the power consumed by the circuit 12 consisting of diode $D_2$ and capacitor $C_2$ and by the load connected to the terminals of said capacitor $C_2$ is derived from the winding $S_1$ and not from the vertical scanning circuit.

However, a current supply from the circuit 12 is not without influence on the intensity of the currents which flow through the diode $D_1$ and the thyristor $TH_1$. In fact, as shown in FIG. 6 which is a diagram of variation, as a function of the time interval t, in intensity $I_L$ of the current flowing through the inductance coil $L_S$ when a load is connected to the terminal $S_2$, the intensity $I_L$ exhibits a peak 15 in respect of positive values of the current corresponding to conduction of the diode $D_1$.

The supply voltage obtained at the point $S_2$ is adjusted to the desired value by the choice of the number of turns of the winding $S_1$ of the transformer $T_L$. If this number does not make it possible to obtain the desired intensity within the deflector $D_v$, it is possible in that case to obtain a suitable value of intensity, for example by modifying the inductance $L_S$ and/or the impedance of the deflector $D_v$.

Conversely, the vertical deflector does not interfere with the operation of the d.c. supply. One condition must nevertheless be satisfied in order to obtain this result: the voltage $V_S$ at the terminals of the capacitor $C_F$ (shown in FIG. 8) must remain below the peak voltage $V_1$ at the terminals of the winding $S_1$.

Since the current $I_S$ which passes through the vertical deflector $D_v$ varies in a sawtooth waveform (as shown in FIG. 7), the output voltage $V_S$ at the terminals of the capacitor $C_F$ (FIG. 8) has a high value during the field-scanning retrace interval. Whereas the voltage $V_S$ remains distinctly lower than the peak voltage $V_1$ during the field-scanning trace interval, said voltage assumes high values during the field-scanning retrace interval. The vertical scanning circuit must therefore be so designed as to ensure that said voltage $V_S$ does not exceed the peak voltage $V_1$ during the field retrace interval. It has been found in practice that this additional condition does not impose any restriction in the construction of the field scanning circuit since this condition is satisfied in all practical circuit designs.

The diode $D_2$ and the filtering capacitor $C_2$ can perform a protective function with respect to parasitic pulses which may arise from switching of the active switch, for example.

The circuit shown in FIG. 1 is mainly employed in transistorized color television receivers.

What is claimed is:

1. A generator for supplying a d.c. voltage, especially to the amplifiers of the video stage in a television receiver, comprising a vertical scanning circuit in which the power for producing the current which passes through the vertical deflector is drawn solely from a cicuit supplied by means of line retrace pulses delivered by the secondary winding of a transformer, a capacitor in series with the vertical deflector being such that the voltage at the terminals of the assembly comprising said deflector and said capacitor has a constant sign which is independent of the direction of the current flowing through said deflector, the circuit being provided with an active switch which comprises a diode mounted in parallel, but in the opposite direction, with respect to a thristor or a transistor, said active switch being controlled and modulated at the line frequency, and wherein a rectifier circuit comprising a diode in the same direction as the diode of the active switch is connected to and is powered by said secondary winding of said vertical scanning circuit in order to deliver said d.c. supply voltage.

2. A generator according to claim 1 wherein the rectifier circuit comprises a capacitor in series with said diode.

3. A generator according to claim 2, wherein the signal delivered by the secondary winding is fed to the anode of the diode and wherein the d.c. output voltage is collected at the terminals of the capacitor.

4. A generator according to claim 1, wherein the active switch is placed between one terminal of the secondary winding and ground and the rectifier circuit is placed between the other terminal of said secondary winding and ground.

5. A television receiver, especially a transistorized color receiver, wherein said receiver comprises a vertical scanning circuit and a generator according to claim 1.

* * * * *